United States Patent
Tubert

(10) Patent No.: US 9,706,147 B2
(45) Date of Patent: Jul. 11, 2017

(54) PIXEL CIRCUIT WITH FAST READ OUT

(71) Applicant: STMicroelectronics (Grenoble 2) SAS, Grenoble (FR)

(72) Inventor: Cedric Tubert, Saint-Egreve (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 117 days.

(21) Appl. No.: 14/600,887

(22) Filed: Jan. 20, 2015

(65) Prior Publication Data

US 2015/0215559 A1    Jul. 30, 2015

(30) Foreign Application Priority Data

Jan. 24, 2014    (FR) .................................... 14 50614

(51) Int. Cl.
| H04N 1/03 | (2006.01) |
| H04N 5/374 | (2011.01) |
| H01L 27/146 | (2006.01) |
| H04N 5/378 | (2011.01) |

(52) U.S. Cl.
CPC ..... *H04N 5/3741* (2013.01); *H01L 27/14612* (2013.01); *H01L 27/14636* (2013.01); *H01L 27/14641* (2013.01); *H01L 27/14643* (2013.01); *H04N 5/378* (2013.01)

(58) Field of Classification Search
CPC .................................................. H04N 5/3741
USPC ................... 348/300, 308; 250/208.1
See application file for complete search history.

(56) References Cited

U.S. PATENT DOCUMENTS

2002/0175270 A1* 11/2002 Boemler .......... H01L 27/14603
                                                         250/208.1
2006/0208163 A1    9/2006 Manabe et al.
2012/0314109 A1    12/2012 Murakami et al.

FOREIGN PATENT DOCUMENTS

GB    2466213 A    6/2010
JP    2006179848 A    7/2006

OTHER PUBLICATIONS

INPI Search Report and Written Opinion for FR 1450614 dated Nov. 13, 2014 (7 pages).

* cited by examiner

*Primary Examiner* — Joel Fosselman
(74) *Attorney, Agent, or Firm* — Gardere Wynne Sewell LLP

(57) ABSTRACT

An image sensor includes a first photodiode with associated first sense node and a second photodiode with associated second sense node. A first transistor has its control node coupled to the first sense node and a second transistor has its control node coupled to the second sense node. The conduction paths (for example, source-drain paths) of the first and second transistors are coupled in series between first and second column lines associated with a column of the image sensor array. Switches control connection of the first and second column lines in two modes: one mode where a voltage is applied to the first column line and data from one of the photodiodes is read out by the second column line; and another mode where a voltage is applied to the second column line and data from the other of the photodiodes is read out by the first column line.

21 Claims, 4 Drawing Sheets

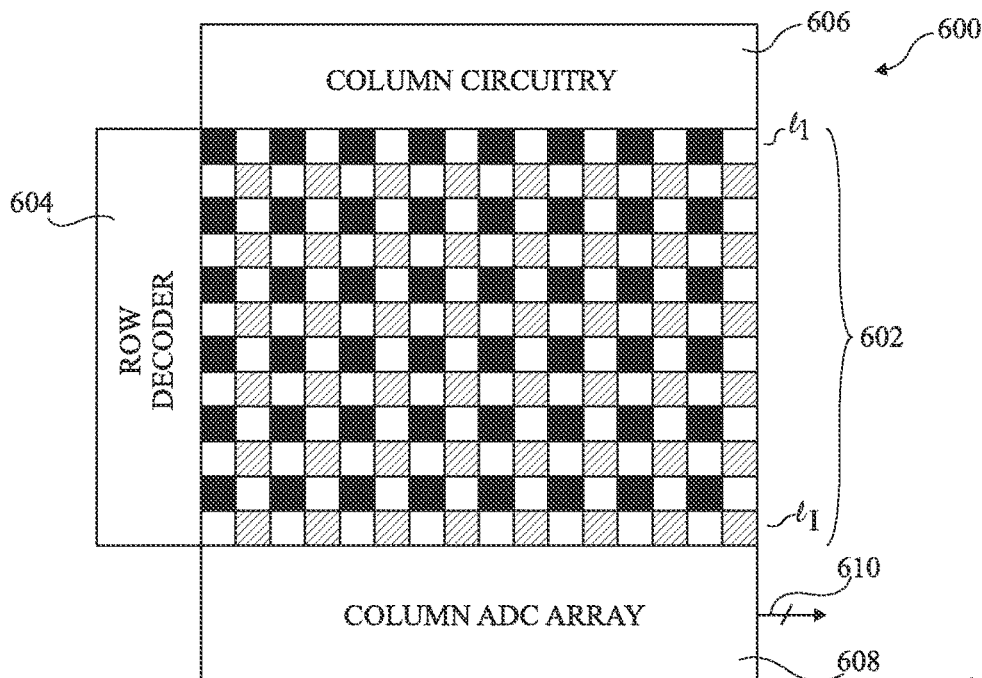
Fig 6
| LINE CYCLE | 1 | 2 | 3 | 4 | 5 | 6 | 7 | 8 | 9 |
|---|---|---|---|---|---|---|---|---|---|
| $l_i$ | SI |  | RD |  |  |  |  |  |  |
| $l_{i+1}$ |  | SI |  | RD |  |  |  |  |  |
| $l_{i+2}$ |  |  | SI |  | RD |  |  |  |  |
| $l_{i+3}$ |  |  |  | SI |  | RD |  |  |  |
| $l_{i+4}$ |  |  |  |  | SI |  | RD |  |  |
| $l_{i+5}$ |  |  |  |  |  | SI |  | RD |  |
| $l_{i+6}$ |  |  |  |  |  |  | SI |  | RD |
Fig 7A
| LINE CYCLE | 1 | 2 | 3 | 4 | 5 | 6 | 7 | 8 | 9 |
|---|---|---|---|---|---|---|---|---|---|
| $l_i$ | SI | RD |  |  |  |  |  |  |  |
| $l_{i+1}$ |  |  | SI | RD |  |  |  |  |  |
| $l_{i+2}$ |  | SI | RD |  |  |  |  |  |  |
| $l_{i+3}$ |  |  |  | SI | RD |  |  |  |  |
| $l_{i+4}$ |  |  |  |  | SI | RD |  |  |  |
| $l_{i+5}$ |  |  |  |  |  |  | SI | RD |  |
| $l_{i+6}$ |  |  |  |  |  | SI | RD |  |  |
Fig 7B
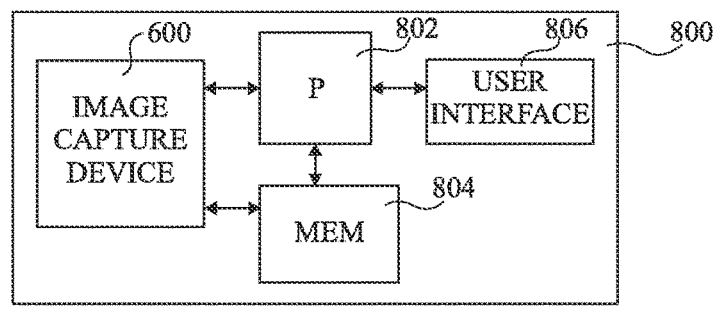
Fig 8

PIXEL CIRCUIT WITH FAST READ OUT

PRIORITY CLAIM

This application claims priority from French Application for Patent No. 1450614 filed Jan. 24, 2014, the disclosure of which is incorporated by reference.

TECHNICAL FIELD

The present disclosure relates to the field of image sensors, and in particular to a pixel circuit of an image sensor and to a method of reading a pixel value.

BACKGROUND

In the field of CMOS image sensors, there is a continuing need for pixel circuits having fewer transistors in order to permit increased resolutions and/or reduced surface area.

One technique often used for reducing the number of transistors in each pixel circuit is to use common reset and read transistors for multiple photodiodes. The number of transistors in a pixel circuit is generally expressed as the number of transistors per photodiode, and the use of multiple photodiodes can permit the number of transistors per photodiode to be reduced to two or less.

Indeed, in such a pixel circuit, each photodiode is usually associated with a corresponding transistor forming a transfer gate, for transferring charge accumulated by the photodiode to a sense node. The pixel circuit further comprises a reset transistor for resetting the photodiodes, and a read transistor for selectively coupling the sense node to an output line via a source follower transistor. Reference is made to United States Patent Application Publication No. 2006/0208163 (incorporated by reference) which further proposes a pixel circuit without any read transistor.

However, there are difficulties in reducing the number of transistors in each pixel circuit without also reducing the speed at which the pixels of the image sensor can be read. There is a need in the art to at least partially address one or more problems in the prior art.

SUMMARY

According to one aspect, there is provided a circuit of an image sensor comprising: a first transistor having its control node coupled to a first sense node, the first sense node being coupled to at least one photodiode; and a second transistor having its control node coupled to a second sense node, the second sense node being coupled to at least one photodiode; wherein said first and second transistors are coupled in series with each other between first and second column lines.

According to one embodiment, the first sense node is coupled to a first photodiode via a first transfer transistor and to a second photodiode via a second transfer transistor; and the second sense node is coupled to a third photodiode via a third transfer transistor and to a fourth photodiode via a fourth transfer transistor.

According to one embodiment, the first, second, third and fourth photodiodes are positioned in consecutive rows of a column of a pixel array of the image sensor.

According to one embodiment, the first, second, third and fourth photodiodes are positioned in a two-by-two pixel block of a pixel array of the image sensor.

According to one embodiment, the first transistor has a first main current node coupled to said first column line; the second transistor has a first main current node coupled to the second column line; and the second main current nodes of the first and second transistors are coupled together.

According to one embodiment, the circuit further comprises: a first reset transistor coupled between the first sense node and a first variable voltage level; and a second reset transistor coupled between the second sense node and a second variable voltage level.

According to one embodiment, the circuit further comprises a plurality of switches adapted to switch the first and second column lines between first and second configurations, wherein: in the first configuration, the first column line is coupled to a supply voltage level and the second column line is coupled to a column output node; and in the second configuration, the second column line is coupled to the supply voltage level and the first column line is coupled to the column output node.

According to one embodiment, the circuit further comprises a control circuit adapted to control the switches to be in one of the first and second configurations during a read operation of a voltage at the first sense node, and adapted to control the switches to be in the other of the first and second configurations during a read operation of a voltage at the second sense node.

According to a further aspect of the present disclosure, there is provided an image sensor comprising an array of photodiodes, arranged in rows and columns, each column comprising a plurality of the above circuits, each circuit comprising at least two of the photodiodes of the column.

According to yet a further aspect of the present disclosure, there is provided an electronic device comprising: a processing device; and the above image sensor.

According to yet a further aspect of the present disclosure, there is provided a method comprising: reading, using the above circuit, a pixel value captured by the first photodiode.

According to one embodiment, reading the pixel value comprises: applying a first supply voltage to the control node of the second transistor to activate the second transistor; applying a second supply voltage to one of the first and second column lines; and reading the pixel value via the other of the first and second column lines.

According to one embodiment, applying the first supply voltage to the control node of the second transistor comprises activating a reset transistor coupled between the second sense node and the first supply voltage.

According to one embodiment, applying the second supply voltage to one of the first and second column lines and reading the pixel value via the other of the first and second column lines comprises controlling a plurality of switches to couple one of the first and second column lines to the second supply voltage and to couple the other of the first and second column lines to a column output node.

BRIEF DESCRIPTION OF THE DRAWINGS

The foregoing and other features and advantages will become apparent from the following detailed description of embodiments, given by way of illustration and not limitation with reference to the accompanying drawings, in which:

FIG. 6 schematically illustrates an image sensor coupling a pixel array according to an example embodiment of the present disclosure;

FIGS. 7A and 7B represent cycles of integration and read operations in the image sensor of FIG. 6 according to an example embodiment of the present disclosure; and FIG. 8 illustrates an electronic device according to an example embodiment of the present disclosure.

DETAILED DESCRIPTION OF THE DRAWINGS

Figure 1:
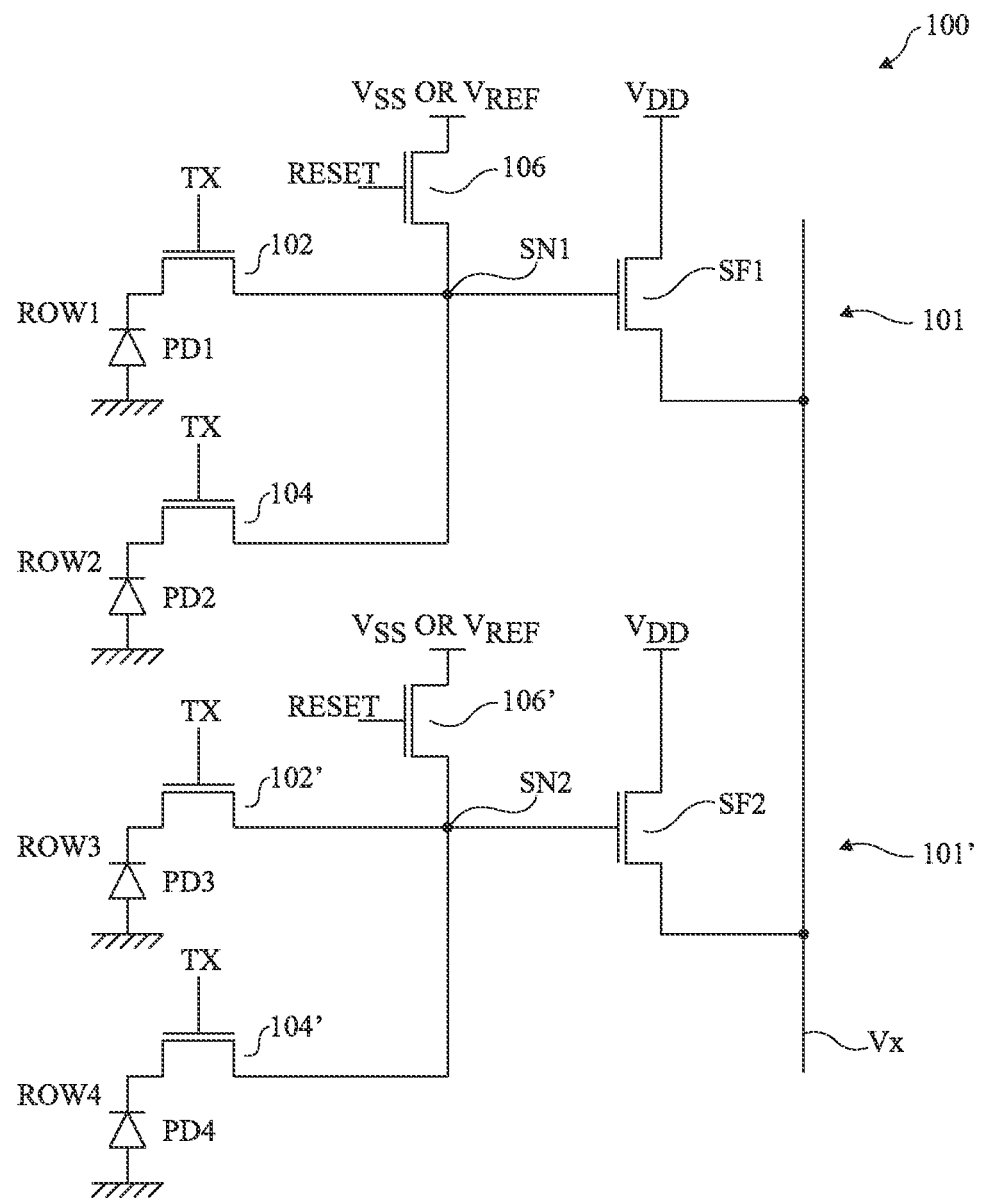
FIG. 1 illustrates pixel circuits that have been proposed.
Figure 4:
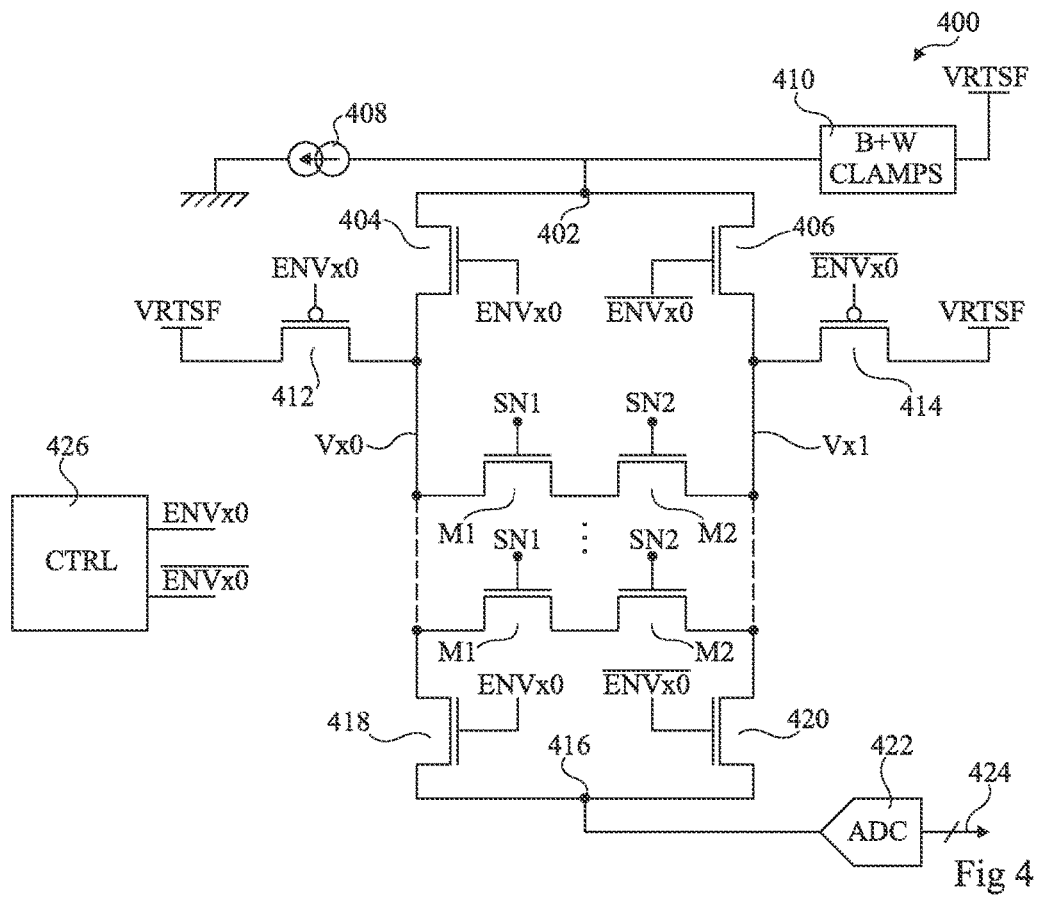
FIG. 4 illustrates a column of an image sensor according to an example embodiment of the present disclosure.

FIG. 1 schematically illustrates circuitry 100 of an image sensor and substantially reproduces FIG. 4 of the United States Patent Application Publication No. 2006/0208163. The circuitry 100 comprises four photodiodes PD1 to PD4 split between two pixel circuits 101 and 101', sometimes referred to in the art as 2T pixels, which have no read transistor.

The photodiodes PD1 and PD2 are in corresponding rows ROW1 and ROW2 of the image sensor and form part of the pixel circuit 101 having a sense node SN1. The photodiodes PD1 and PD2 are coupled to the sense node SN1 via corresponding transfer transistors 102, 104 controlled by transfer signals Tx. The sense node SN1 is coupled to the gate of a source follower transistor SF1, which is in turn coupled between a supply voltage $V_{DD}$ and a column line Vx. The sense node SN1 is also coupled to a supply level $V_{SS}$ or $V_{REF}$ via a reset transistor 106 controlled by a reset signal RESET.

Similarly, the photodiodes PD3 and PD4 are in corresponding rows ROW3 and ROW4 of the image sensor, and form part of the pixel circuit 101' having a sense node SN2. The photodiodes PD3 and PD4 are coupled to the sense node SN2 via corresponding transfer transistors 102', 104' controlled by transfer signals Tx. The sense node SN2 is coupled to the gate of a source follower transistor SF2, which is in turn coupled between the supply voltage $V_{DD}$ and the column line Vx. The sense node SN2 is also coupled to the supply level $V_{SS}$ or $V_{REF}$ via a reset transistor 106' controlled by a reset signal RESET.

In operation, when the signal from the row ROW1 is to be read out, the reset transistor 106 is turned on such that a high voltage reference $V_{REF}$ is applied to the sense node SN1. The other sense nodes of the other pixel circuits are placed at voltage $V_{SS}$ through their respective reset transistors. Thus, only the node SN1 associated with the mw to be read is at a high voltage, while all the other sense nodes are at a low voltage.

Next, the reset transistor for the row to be read is turned off, and the transfer gate for the mw is turned on. The accumulated charge from the photodiode is then transferred to the sensor node SN1, and the signal produced by the photodiode of the pixel in row ROW1 is then amplified by the source follower transistor SF1 and provided on the column line Vx. The reset transistor 106 is then coupled again to the low voltage $V_{SS}$.

A drawback of the circuit of FIG. 1 is that it is not possible to reset the voltage at the sense node of one pixel circuit at the same time as a sense node of another pixel circuit in the same column is being read. For example, a reset of the photodiode 102 involves activating the reset transistor 106 to apply the high voltage $V_{REF}$ to the sense node SN1, thereby causing the source follower transistor SF1 to be activated. Therefore, the column line Vx can not be used to read out a voltage from another pixel circuit. An integration phase of each photodiode is generally initiated by a reset operation. Thus, in the circuit of FIG. 1, the start integration operations for the pixels of a column must be performed in series, and not in parallel, with the read operations of the pixels in the column, leading to a slow read out of the pixels of the image sensor.

A further drawback is that, while in other types of circuits a relatively low voltage of 0.3 to 0.5 V can be applied to the sense nodes of the pixels in order to reduce dark current, this is not possible in the circuit of FIG. 1. Consequently, the transistors SF1 and SF2 have relatively high threshold voltages in order to avoid drain/source leakage. This leads to a lower charge to voltage factor (CVF) of the source follower transistor during read operations.

Figure 2:
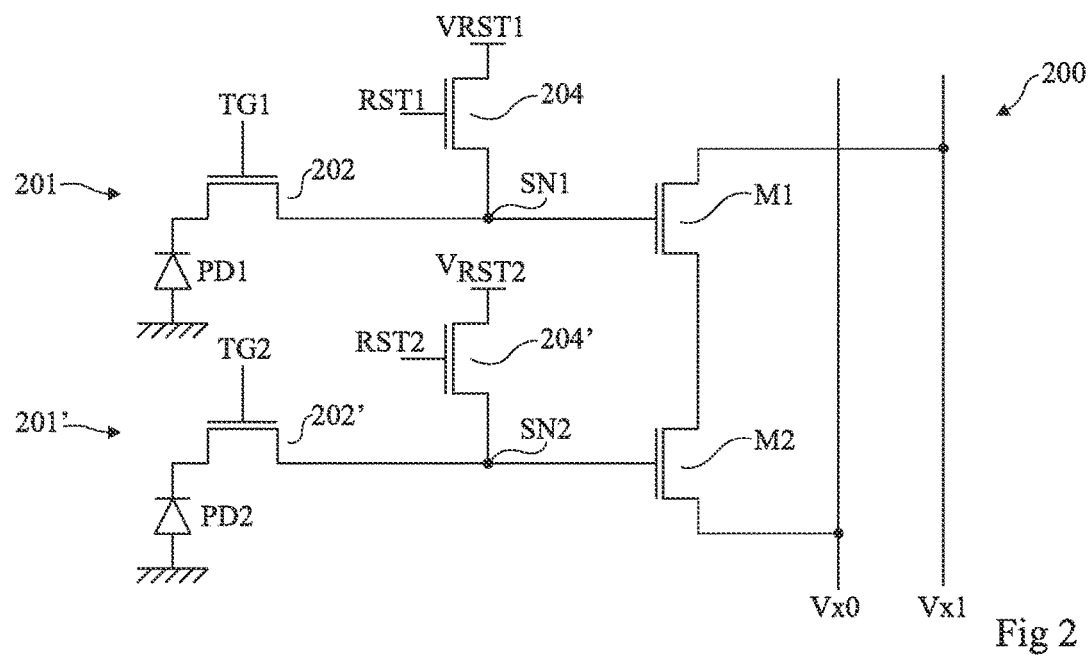
FIG. 2 illustrates pixel circuits according to an example embodiment of the present disclosure.

FIG. 2 schematically illustrates a circuit 200 of an image sensor array comprising two pixel circuits 201, 201' each having a single photodiode PD1 and PD2 respectively. For example, the photodiodes PD1 and PD2 correspond to pixels in adjacent rows of a same column of an image sensor array.

The photodiode PD1 of pixel circuit 201 is coupled via a transfer transistor 202 to a sense node SN1, which is in turn coupled to the control node of a transistor M1. The sense node SN1 is also coupled to a variable supply voltage VRST1 via a reset transistor 204 controlled at its control node by a reset signal RST1. The voltage VRST1 is for example variable between a high level of between 2.3 and 2.7 V, and a low level of between 0.3 and 0.5 V, such that dark current can be limited during the integration phase.

Similarly, the photodiode PD2 of the other pixel circuit 201' is coupled via a transfer transistor 202' to a sense node SN2, which is in turn coupled to the control node of a transistor M2. The sensor node SN2 is also coupled to a variable supply voltage VRST2 via a reset transistor 204' controlled with this control node by a reset signal RST2.

The transfer transistors 202, 202', reset transistors 204, 204' and the transistors M1, M2 are for example MOS transistors, although in alternative embodiments other transistor technologies could be used.

One of the main current nodes of the transistor M2, for example its sense node, is coupled to a column line Vx0, and one of the main current nodes of the transistor M1, for example its sense node, is coupled to another column line Vx1. The other main current nodes of the transistors M1 and M2, which are for example their drain nodes, are coupled together.

By coupling the transistors M1 and M2 from neighboring pixel circuits in series with each other between the two column lines Vx0 and Vx1, the role of each of these transistors can be either that of a source follower transistor or that of a read transistor. For example, the transistor M1 operates as a source follower transistor during a read operation of the photodiode PD1, and as a read transistor during a read operation of the photodiode PD2. Conversely, the transistor M2 operates as a source follower transistor during a read operation of the photodiode PD2, and as a read transistor during a read operation of the photodiode PD1.

When the photodiode PD1 is to be read, the transistor M2 is activated by a high voltage at the sense node SN2. In particular, the signal RST2 and the voltage level VRST2 are both high, such that the sense node SN2 is coupled to a high voltage level. The voltage level VRST1 is also at a high level, and the signal RST1 is brought high for a short time to pre-charge the voltage level of the sense node SN1. Once the signal RST1 has gone low again, the transfer signal TG1 is brought high to transfer the accumulated charge from the photodiode PD1 to the sense node SN1. The column line Vx1 is coupled to a high voltage level VRTSF, such that the voltage at the sense node SN1 is read out via the column line Vx0.

When the photodiode PD2 is to be read, the transistor M1 is activated by a high voltage at the sense node SN1. In particular, the signal RST1 and the voltage level VRST1 are both high, such that the sense node SN1 is coupled to a high voltage level. The voltage level VRST2 is also at a high level, and the signal RST2 is brought high for a short time to pre-charge the voltage level of the sense node SN2. Once the signal RST2 has gone low again, the transfer signal TG2 is brought high to transfer the accumulated charge from the photodiode PD2 to the sense node SN2. The column line Vx0 is coupled to a high voltage level VRTSF, such that the voltage at the sense node SN2 is read out via the column line Vx1.

It will be apparent to those skilled in the art that it would be equally possible, when reading the voltage from the sense node SN1, to couple the high voltage level VRTSF to the column line Vx0 and read out the voltage from the sense node SN1 via the column line Vx1. Similarly, it would be equally possible, when reading the voltage from the sense node SN2, to couple the high voltage level VRTSF to the column line Vx1 and read out the voltage from the sense node SN2 via the column line Vx0. However, the column line used for reading the sense node voltage, for example, changes for the sense nodes SN1 and SN2, such that the output path is equivalent for both read operations.

In the embodiment of FIG. 2, the pixel circuits 201, 201' are adjacent pixel circuits, and the photodiodes PD1 and PD2 are part of a same column of the image sensor. However, it will be apparent to those skilled in the art that in alternative embodiments the pixels circuit may not be adjacent, and the photodiodes could be separated by one or more other photodiodes, and could be in different columns.

Figure 3:
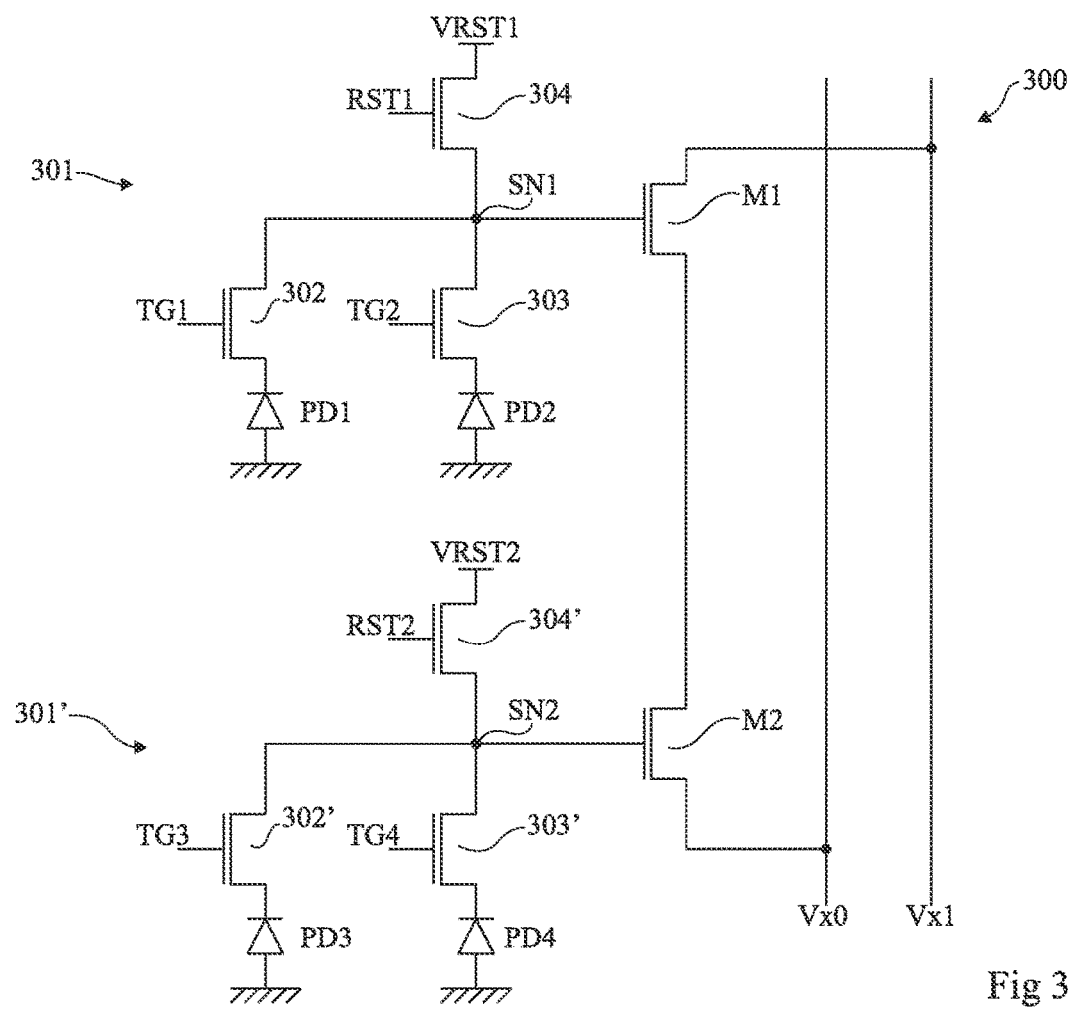
FIG. 3 illustrates pixel circuits according to a further example embodiment of the present disclosure.

FIG. 3 schematically illustrates a circuit 300 of an image sensor, similar to the circuit of FIG. 2, but in which each pixel circuit comprises a pair of photodiodes. In particular, the sense node SN1 is coupled to a photodiode PD1 via a transfer transistor 302 controlled by a transfer signal TG1, and to a photodiode PD2 via a further transfer transistor 303 controlled by a transfer signal TG2. Similarly, the sense node SN2 is coupled to a photodiode PD3 via a transfer transistor 302' controlled by a transfer signal TG3, and to a further photodiode PD4 via a further transfer transistor 303' controlled by a transfer signal TG4.

For example, the photodiodes PD1 to PD4 correspond to pixels in four consecutive rows of a same column of an image sensor array. Alternatively, the photodiodes PD1 to PD4 could form a two-by-two grid of pixels.

In operation, the reading of the photodiodes PD1 or PD2 is for example achieved in the same way as reading of photodiode PD1 as described in relation to FIG. 2, by asserting the corresponding transfer signal TG1 or TG2. Similarly, the reading of the photodiodes PD3 or PD4 is for example achieved in the same way as reading of photodiode PD2 as described in relation to FIG. 2, by asserting the corresponding transfer signal TG3 or TG4.

While the pixel circuits of FIG. 3 each comprise two photodiodes, in alternative embodiments the sense nodes SN1 and SN2 could additionally be coupled via further transfer transistors to further photodiodes, each pixel circuit comprising for example four or more photodiodes.

FIG. 4 illustrates one column 400 of an image sensor comprising the pixel circuits of FIG. 2 or FIG. 3 according to an example embodiment. As illustrated, pairs of the transistors M1, M2 of pairs of pixel circuits are coupled in series between the column lines Vx0 and Vx1. Two such pairs of pixel circuits are illustrated in FIG. 4, and as represented by dots, there may be further intermediate pairs of pixel circuits coupled between the column lines Vx0 and Vx1.

One end of the column line Vx0 is coupled to a supply node 402 via a transistor 404, which is for example an NMOS transistor, controlled at its control node by an enable signal ENVx0. Similarly, one end of the column line Vx1 is coupled to the supply node 402 via a transistor 406, which is for example an NMOS transistor, controlled at its control node by the inverse of the enable signal ENVx0. The supply node 402 is for example coupled to ground via a current source 408, and to black and white clamps (B+W CLAMPS) 410, which are in turn coupled to the supply voltage VRTSF. The white clamp is used to maintain an appropriate current level in the current mirror 408 in case of nearly white pixels, and the black clamp is used to avoid the dark sun effect.

The column line Vx0 is also coupled to the supply voltage VRTSF via a transistor 412, which is for example a PMOS transistor controlled by the enable signal ENVx0. The column line Vx1 is also coupled to the supply voltage VRTSF via a transistor 414, which is for example a PMOS transistor controlled by the inverse of the enable signal ENVx0. The supply voltage VRTSF is for example in the range 2.3 to 2.7 V.

The other end of the column line Vx0 is for example coupled to an output node 416 of the column 400 via a transistor 418, which is for example an NMOS transistor controlled by the enable signal ENVx0. Similarly, the other end of column line Vx1 is coupled to the output node 416 via a transistor 420, which is for example an NMOS transistor controlled by the inverse of the enable signal ENVx0. The output node 416 is coupled to an ADC (analog to digital converter) 422, which provides the digital output value of the column on output lines 424. A control circuit 426 for example provides the control signal ENVx0 for controlling the various switches 404, 406, 412, 414, 418, 420.

In operation, when the enable signal ENVx0 is high, the column line Vx1 is coupled to the supply voltage VRTSF and the column line Vx0 is coupled to the supply node 402 and to the output node 416 of the column. In this configuration, one of the sense nodes SN1, SN2 of each pair of pixel circuits is read via the column line Vx0. When the enable signal ENVx0 is low, the column line Vx0 is coupled to the supply voltage VRTSF and the column line Vx1 is coupled to the supply node 402 and to the output node 416 of the column. In this configuration, the other of the sense nodes SN1, SN2 of each pair of pixel circuits is read via the column line Vx1.

Figure 5:
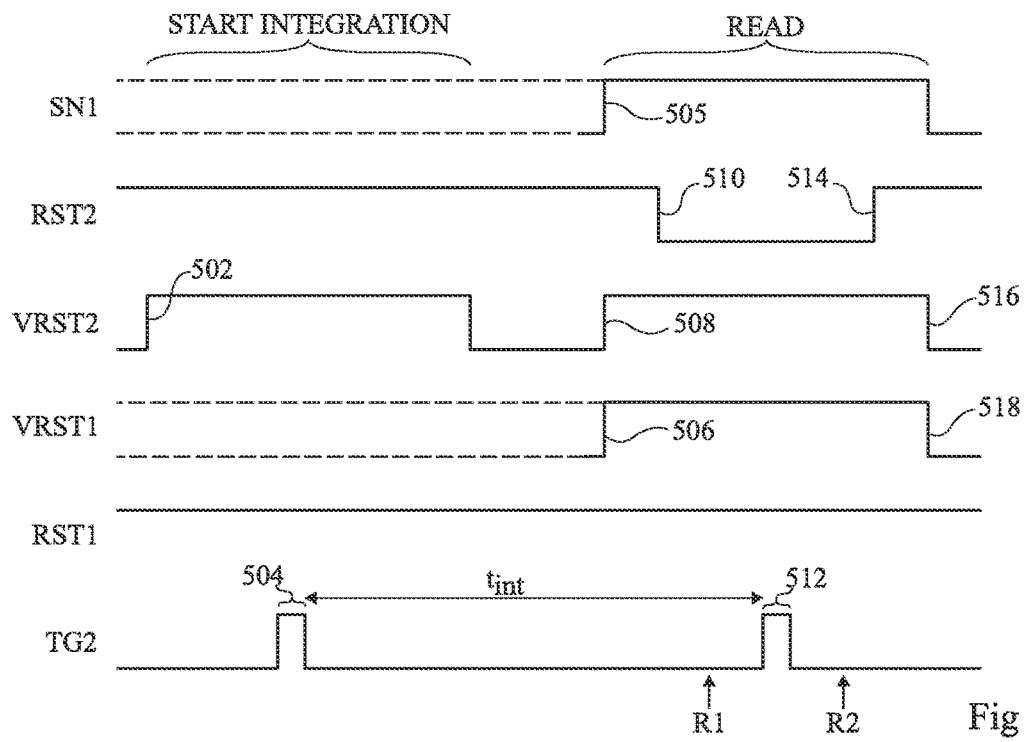
FIG. 5 is a timing diagram illustrating signals during integration and read operations according to an example embodiment of the present disclosure.

FIG. 5 is a timing diagram illustrating an example of the voltage at the sense node SN1 and the signals RST2, VRST2, VRST1, RST1 and TG2 in the circuit of FIG. 2 during integration and read operations of the photodiode PD2. It will be apparent to those skilled in the art how the signals can be adapted for reading the photodiode PD1 of FIG. 2, or any of the photodiodes PD1 to PD4 of FIG. 3.

An integration period $t_{int}$ of the photodiode PD2 is triggered by a start integration operation (START INTEGRATION) which involves, while the reset signal RST2 is asserted, bringing the signal VRST2 high as shown by a rising edge 502. The sense node SN2 is thus brought to a high voltage. While the voltage VRST2 is high, a high pulse 504 of the transfer gate signal TG2 causes charge to be evacuated from the photodiode PD2. The integration period $t_{int}$ is then triggered by the falling edge of the high pulse 504 of the transfer gate signal TG2, and the voltage VRST2 for example then goes low again.

A read operation (READ) of the photodiode involves applying a high voltage to the sense node SN1 as shown by a rising edge 505. For this, the voltage VRST1 is brought high as shown by a rising edge 506, while the reset voltage RST1 is asserted. The voltage VRST2 is also brought high while the reset signal RST2 is asserted as shown by a rising edge 508, in order to pre-charge the sense node SN1 to a high voltage. The reset signal RST2 is then brought low as shown by a falling edge 510, and read operations R1 and R2 are for example performed before and after a high pulse 512 of the signal TG2, as indicated by arrows in FIG. 5. The rising edge of the pulse 512 ends the integration period $t_{int}$. The reset signal RST2 is then for example reasserted, as shown by a rising edge 514, and the voltages VRST2 and VRST1 are for example brought low, as shown by falling edges 516 and 518 respectively.

As shown by dashed lines in FIG. 5, the levels of the voltage VRST1 and the voltage at the sense node SN1 during the start integration operation can be high or low, and are thus compatible with a read operation of the photodiode PD1 during this operation. Indeed, such a read operation can occur while the signal VRST2 is asserted.

FIG. 6 illustrates an image sensor 600 comprising an array 602 of pixels arranged in columns and rows. In the example of FIG. 6, the pixel array 602 comprises 16 columns and 12 rows of pixels, although in alternative embodiments there could be a different number of columns and rows. The rows in the array 602 are labeled to $l_1$ to $l_j$. The rows of pixels forming odd columns of the array 602 have photodiodes that alternate between blue (shown by shaded squares) and green (shown by empty squares). The rows of pixels forming even columns of the array 602 have photodiodes that alternate between green and red (shown by striped squares). Thus two-by-two blocks of pixels comprise one red, one blue, and two green photodiodes.

A row decoder (ROW DECODER) 604 provides signals to the rows of the array, such as the reset signal RSTi, and the transfer gate signals TGi, for the corresponding row $l_i$. Column circuitry (COLUMN CIRCUITRY) 606 for example provides the supply voltages VRST and VRTSF to each pixel via one or the other of the column lines Vx0 and Vx1, as described above. A column ADC array (COLUMN ADC ARRAY) 608 for example comprises ADCs (analog to digital converter), which convert the voltages read via the column lines to digital signals provided on output lines 610.

In the case that the pixel array 602 comprises the pixel circuit 200 of FIG. 2, the photodiodes PD1 and PD2 are for example adjacent to each other and in a same column. For example, in the odd columns, the photodiodes PD1 and PD2 for example correspond to adjacent blue and green photodiodes, and in the even columns, the photodiodes PD1 and PD2 for example correspond to adjacent green and red photodiodes.

Alternatively, in the case that the pixel array 602 comprises the pixel circuits of FIG. 3, the photodiodes PD1 to PD4 for example correspond to photodiodes in four consecutive rows of a same column of the array. In such a case, different operations should not be performed at the same time on each of the photodiodes coupled to a same sense node. Examples of the timing of operations in the case of video capture using a rolling shutter will now be described with reference to FIGS. 7A and 7B.

FIG. 7A is a table illustrating an example of operations performed during line cycles in the pixel array of FIG. 6 during video capture that is performed using a rolling shutter. Start integration (SI) operations are for example performed during consecutive cycles on consecutive rows of the array, starting with a first row $l_i$ of the array in a cycle 1, and so on. The read operation is for example performed for each line two cycles after the start integration operation, such that the photodiodes of consecutive lines do not have start integration and read operations occurring in the same cycle.

FIG. 7B is a table illustrating an example of operations performed during line cycles in the pixel array of FIG. 6 according to an alternative embodiment in which the integration period is reduced to a single cycle by performing the start integration operations on consecutive cycles in the order of rows $l_i$, $l_{i+2}$, $l_{i+1}$, $l_{i+3}$, $l_{i+4}$, $l_{i+6}$, $l_{i+5}$ etc. In an alternative embodiment, a similar result could be achieved by positioning the photodiodes PD1, PD2, PD3 and PD4 of the pixel circuit of FIG. 3 in rows $l_i$, $l_{i+2}$, $l_{i+1}$ and $l_{i+3}$ respectively of the pixel array.

FIG. 8 illustrates an electronic device 800 comprising the image sensor (IMAGE CAPTURE DEVICE) 600 of FIG. 6. The electronic device 800 further comprises a processing device (P) 802 coupled to the image sensor, and for example comprising one or more processors. A memory (MEM) 804 is coupled to the processing device 802, and for example receives and stores images captured by the image sensor 600. A user interface (USER INTERFACE) 806 is also for example coupled to the processing device 804, and for example comprises a display, touch screen, and/or other user input device.

The electronic device 800 is for example a digital camera, tablet computer, mobile telephone or smart phone, or other portable electronics devices comprising an image sensor.

An advantage of the embodiments described herein is that, within a same column of an image sensor, a read operation can be performed in one pixel circuit at the same time as a reset operation in another pixel circuit. This leads to a relatively fast read-out operation of the pixels of the image sensor. Furthermore, advantageously, the transistors M1 and M2 of the pixel circuits that are coupled in series may have a relatively low threshold voltage, and a relatively high charge to voltage factor (CVF) can therefore be achieved.

A further advantage is that, with respect to the circuitry of FIG. 1, there is no longer a supply voltage $V_{DD}$ supplied to each pixel circuit. Therefore, the use of two column lines Vx0, Vx1 rather than a single column line does not increase the number of supply lines with respect to the embodiment of FIG. 1.

Having thus described at least one illustrative embodiment, various alterations, modifications and improvements will readily occur to those skilled in the art.

For example, it will be apparent to those skilled in the art that, while embodiments have been described in which the transistors M1 and M2 coupled in series are of adjacent pixel circuits of a same column, in alternative embodiments the pixels circuits could be separated by one or more intermediate pixel circuits, and they are not necessarily in the same column.

Furthermore, it will be apparent to those skilled in the art that the various features described in relation to the various embodiments could be combined, in alternative embodiments, in any combination.

What is claimed is:
1. A circuit of an image sensor, comprising:
a first transistor having its control node coupled to a first sense node, the first sense node being coupled to at least one photodiode; and a second transistor having its control node coupled to a second sense node, the second sense node being coupled to at least one photodiode;

wherein said first and second transistors are coupled in series with each other between first and second column lines.

2. The circuit of claim 1, wherein:

said first sense node is coupled to a first photodiode via a first transfer transistor and to a second photodiode via a second transfer transistor; and said second sense node is coupled to a third photodiode via a third transfer transistor and to a fourth photodiode via a fourth transfer transistor.

3. The circuit of claim 2, wherein said first, second, third and fourth photodiodes are positioned in consecutive rows of a column of a pixel array of said image sensor.

4. The circuit of claim 2, wherein said first, second, third and fourth photodiodes are positioned in a two-by-two pixel block of a pixel array of said image sensor.

5. The circuit of claim 1, wherein:

said first transistor has a first main current node coupled to said first column line;

said second transistor has a first main current node coupled to said second column line; and second main current nodes of said first and second transistors are coupled together.

6. The circuit of claim 1, further comprising:

a first reset transistor coupled between said first sense node and a first variable voltage level node ; and a second reset transistor coupled between said second sense node and a second variable voltage level node.

7. The circuit of claim 1, further comprising a plurality of switches configured to switch said first and second column lines between first and second configurations, wherein:

in said first configuration, said first column line is coupled to a supply voltage level and said second column line is coupled to a column output node; and in said second configuration, said second column line is coupled to said supply voltage level and said first column line is coupled to said column output node.

8. The circuit of claim 7, further comprising a control circuit configured to control said switches to be in one of said first and second configurations during a read operation of a voltage at said first sense node, and configured to control said switches to be in the other of said first and second configurations during a read operation of a voltage at said second sense node.

9. A method, comprising reading a pixel value captured by said first photodiode using the circuit of claim 1.

10. The method of claim 9, wherein reading said pixel value comprises:

applying a first supply voltage to the control node of said second transistor to activate said second transistor;

applying a second supply voltage to one of said first and second column lines; and reading said pixel value via the other of said first and second column lines.

11. The method of claim 10, wherein applying said first supply voltage to the control node of said second transistor comprises activating a reset transistor coupled between said second sense node and said first supply voltage.

12. The method of claim 10, wherein applying said second supply voltage to one of said first and second column lines and reading said pixel value via the other of said first and second column lines comprises controlling a plurality of switches to couple one of the first and second column lines to said second supply voltage and to couple the other of said first and second column lines to a column output node.

13. An apparatus, comprising:

an image sensor comprising an array of photodiodes arranged in rows and columns, wherein each column comprises a first column line and a second column line;

a first read out circuit coupled to a first photodiode in a first row and first column, said first read out circuit comprising a first transistor having a control terminal coupled to said first photodiode through a first sense node and further having a first conduction terminal coupled to said first column line;

a second read out circuit coupled to a first photodiode in a second row and first column, said second read out circuit comprising a second transistor having a control terminal coupled to said second photodiode through a second sense node and further having a first conduction terminal coupled to said second column line;

wherein a second conduction terminal of said first transistor is directly connected to a second conduction terminal of said second transistor such that said first and second transistors are coupled in series with each other between first and second column lines.

14. The apparatus of claim 13, further comprising a processing device coupled to said image sensor.

15. The apparatus of claim 13, wherein:

said first sense node is coupled to the first photodiode via a first transfer transistor; and said second sense node is coupled to the second photodiode via a second transfer transistor.

16. The apparatus of claim 13, further comprising:

a first reset transistor coupled between said first sense node and a first variable voltage level node ; and a second reset transistor coupled between said second sense node and a second variable voltage level node.

17. An apparatus comprising:

an image sensor comprising an array of photodiodes arranged in rows and columns, wherein each column comprises a first column line and a second column line;

a first read out circuit coupled to a first photodiode in a first row and first column, said first read out circuit comprising a first transistor having a control terminal coupled to said first photodiode through a first sense node and further having a first conduction terminal to said first column line;

a second read out circuit coupled to a first photodiode in a second row and first column, said second read out circuit comprising a second transistor having a control terminal coupled to said second photodiode through a second sense node and further having a first conduction terminal coupled to said second column line;

wherein a second conduction terminal of said first transistor is directly connected to a second conduction terminal of said second transistor; and a plurality of switches configured to switch said first and second column lines between first and second configurations, wherein:

in said first configuration, said first column line is coupled to a supply voltage level and said second column line is coupled to a column output node; and in said second configuration, said second column line is coupled to said supply voltage level and said first column line is coupled to said column output node.

18. The apparatus of claim 17, further comprising a control circuit configured to control said switches to be in one of said first and second configurations during a read operation of a voltage at said first sense node, and configured to control said switches to be in the other of said first and second configurations during a read operation of a voltage at said second sense node.

19. The apparatus of claim 16, further comprising a processing device coupled to said image sensor.

20. The apparatus of claim 16, wherein:
   said first sense node is coupled to the first photodiode via a first transfer transistor; and
   said second sense node is coupled to the second photodiode via a second transfer transistor.

21. The apparatus of claim 16, further comprising:
   a first reset transistor coupled between said first sense node and a first variable voltage level node ; and
   a second reset transistor coupled between said second sense node and a second variable voltage level node.

* * * * *

UNITED STATES PATENT AND TRADEMARK OFFICE
CERTIFICATE OF CORRECTION

PATENT NO. : 9,706,147 B2  
APPLICATION NO. : 14/600887  
DATED : July 11, 2017  
INVENTOR(S) : Tubert Page 1 of 1

It is certified that error appears in the above-identified patent and that said Letters Patent is hereby corrected as shown below:

In the Specification

Column 3, Line number 49, replace [[mw]] with -- row --.

Column 3, Line number 53, replace [[mw]] with -- row --.

Signed and Sealed this  
Twenty-second Day of August, 2017

Joseph Matal  
*Performing the Functions and Duties of the*  
*Under Secretary of Commerce for Intellectual Property and*  
*Director of the United States Patent and Trademark Office*